United States Patent
Yu et al.

(10) Patent No.: US 7,087,464 B2
(45) Date of Patent: Aug. 8, 2006

(54) METHOD AND STRUCTURE FOR A WAFER LEVEL PACKAGING

(75) Inventors: Dylan Yu, Chi-Lung (TW); Gary Guan, Hsin-Chu (TW); Jolas Chen, Hsin-Chu (TW); Yi-Ming Chang, Hsin-Chu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 10/986,104

(22) Filed: Nov. 12, 2004

(65) Prior Publication Data

US 2005/0077605 A1 Apr. 14, 2005

Related U.S. Application Data

(62) Division of application No. 10/680,434, filed on Oct. 8, 2003.

(51) Int. Cl.
*H01L 21/44* (2006.01)
(52) U.S. Cl. .................................................. 438/113
(58) Field of Classification Search ............ 438/106, 438/51, 125, 612, 613, 127, 113, 107, 108; 428/126
See application file for complete search history.

(56) References Cited

U.S. PATENT DOCUMENTS 5,801,068 A * 9/1998 Sooriakumar et al. ......... 438/51
5,923,796 A * 7/1999 Feldman et al. .............. 385/14
5,936,707 A * 8/1999 Nguyen et al. ............... 355/18

* cited by examiner

*Primary Examiner*—Howard Weiss
*Assistant Examiner*—(Vikki) Hao B. Trinh

(57) ABSTRACT

A method and structure for a wafer level package is provided, which utilizes a plurality of spacer walls on a semiconductor wafer or a transparent substrate, which has the ability to decide the position of the sealant. As a result, the dimension of a device is decided by the position of the sealant and the spacer walls, therefore, shrinking the distance between the photosensitive zone and the sealant will enhance the gross dies after performing a die sawing process to the whole semiconductor wafer. In addition, the semiconductor process decides the height of the spacer walls so that the yield will be improved due to the fact that a uniformity of the gap, which is between the semiconductor wafer and the transparent substrate, and the width of sealant, will be controlled.

12 Claims, 7 Drawing Sheets

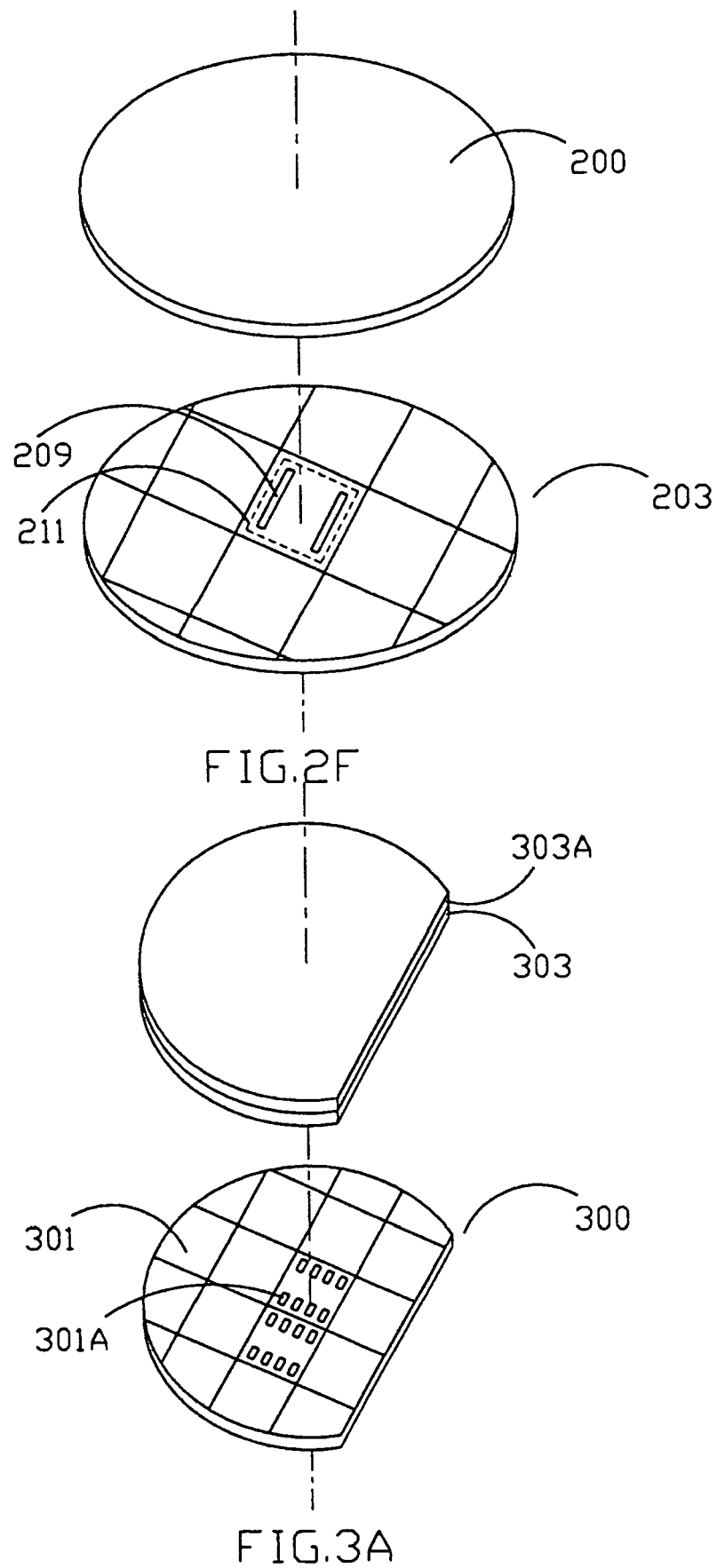

METHOD AND STRUCTURE FOR A WAFER LEVEL PACKAGING

This application is a division of prior application Ser. No. 10/680,434 filed Oct. 8, 2003.

BACKGROUND OF THE INVENTION

1. Field of the Invention

The present invention relates to a wafer level packaging, and more specifically to form spacer walls and sealant on a wafer or transparent substrate at a wafer level package.

2. Description of the Prior Art

In recent years, since the circuit devices in a chip are manufactured with a high density, the IC package is also developed to high density, high efficiency and miniaturization. Typically, the packaging can protect the dies from moisture and mechanical damage. In the technology, the semiconductor dies or chips are usually individually packaged in a plastic or ceramic package after accomplishing wafer fabrication. The function of the packaging includes power distribution, signal distribution, heat dissipation, protection and support. As a result, the packaging technique is influenced by the development of integrated circuits, and the trend in electrical products is to have high integration with a small size. Therefore, the integrated circuits will be minimized so that the logic circuits within a chip or die are greatly enhanced, and the input/output (I/O) pins are also increased. In order to coordinate with the requirements and alterations as above, various types of packaging have recently been developed, for instance ball grid array (BGA), chip scale package (CSP), multi chip module package (MCM package), tape carrier package (TCP) and wafer level package (WLP) etc.

No matter what type of packaging, most of the packaging is divided into individual chips before they are packaged. However, the packaging at the wafer level is a trend in semiconductor packaging. Typically, the wafer level package utilizes the whole wafer as an object, not utilizing a single chip or die. Hence, before performing a scribing process, packaging and testing must be accomplished. This is an advanced technique so that the process of wire bonding, mold, die mount and assembly can be omitted so do lead frame and substrate. Therefore, the cost and manufacturing time will be reduced. On the other hand, the process in traditional packaging includes, die saw, die mount, wire bond, mold, trim, mark, plating and inspection etc.

A conventional packaging will be described with reference to FIG. 1A to 1C. Referring to FIG. 1A, providing a semiconductor wafer 101 and a transparent substrate 113 firstly, the semiconductor wafer 101 comprises pluralities of dies 103 thereon, further, the pluralities of dies 103 utilize the semiconductor processes so as to manufacture pluralities of microcircuits thereof (not illustrated). Next, referring to FIG. 1B, each of the dies 103 on the semiconductor wafer 101 is individually separated by a dicing saw machine so that a plurality of individual dies 103 is obtained. Then, the individual dies 103 are placed on a semiconductor wafer 105 by a pick and place arm of a die bonder and then adhered by an epoxy (not illustrated). The semiconductor substrate 105 comprises borders 107, wherein the borders 107 are obtained from a mold with a particular pattern and the semiconductor process. As a result, each individual chip 103 is placed on the semiconductor substrate 105 by a die bonder in the process of a die mount. Thus, the individual dies 103 are easily dropped, resulting in the gross amount of semiconductor wafer 101 dies are greatly reduced, moreover; the yield will be decreased. Thereafter, performing a process of wire bonding in order to transfer the signal from the individual dies 103 to the outside. The process of wire bonding comprises, gold bonding wire 109 wire bonds on the individual dies 103.

Subsequently, as shown in FIG. 1C, after adhering and placing each individual dies 103 on the semiconductor substrate 105, performing a process of mold, wherein a sealant 111 is coated on the borders 107 and then a transparent substrate 113 is covered thereon.

Another process of the sealant is refereed to TFT-LCD process, wherein the spacer balls (not illustrated) are randomly mixed with the sealant 111. The function of the sealant 111 is that the upper substrate of the liquid crystal pannel can adhere compactly with lower one, more, isolating the liquid crystal from the outside. The spacer balls are provided as a support between the upper substrate and the lower substrate. However, the spacer balls have become spheroids while the transparent substrate 113 is a cover. Also, the spacer walls shape is not regular so that the width of the sealant 111 is hard to control, further; the uniformity of the gap, which is between the upper substrate and the lower substrate, is not able to be maintained. Hence, the electric field is variously distributed so that the gray level of the liquid crystal is influenced. Due to the fact that the sealant 111 is a polymer material, it is accessible to have reactions with the liquid crystal, even overflow to a sensor area, which has a die 103. In order to have a safe distance between the sealant 111 and the sensor area, the dimension of the device is not simple to shrink so that the gross dies of a wafer will be decreased, more, the yield is also not improved.

By the processes of the traditional packaging or TFT-LCD process as mentioned above, the position and width of the sealant are not to be precisely and effectively controlled. Therefore, an improved method of packaging is required in order to overcome the problems of the packaging in the prior art.

SUMMARY OF THE INVENTION

It is an objective of the present invention to provide a method and structure for wafer level packaging that utilizes the semiconductor process to form the spacer walls. The position of the sealant and the scope can be precisely decided by placing the sealant beside the inner or outer side wall of the spacer walls. Hence, the distance between the sealant and the photosensitive zone will be reduced so that the gross amount of wafer dies will be improved, moreover; the throughput will be increased.

It is another objective of the present invention to provide a method and structure for a wafer level packaging that utilizes the semiconductor process to form the spacer walls. The uniformity of the gap, which is between the semiconductor wafer and transparent substrate, will be efficiency maintained by controlling the height of the spacer walls. Further, the spacer walls will control the stability and width of the sealant when the semiconductor wafer is covering and adhering to the transparent substrate. Therefore, the yield will be increased.

It is further objective of the present invention to provide a method and structure for a wafer level packaging that utilizes the semiconductor process to form the spacer walls. Hence, the spacer walls can effectively dissipate any heat and protect the die from damage caused by moisture, and the heat from the interior is effectively dissipated to the outside after the semiconductor wafer is covered and adhered on to the transparent substrate.

It is still a further objective of the present invention to provide a method and structure for a wafer level packaging, wherein a scribing process is performed after the wafer and the transparent substrate are adhered. Therefore, any contamination from particles or the dies is greatly reduced. Therefore, the yield will be improved.

According to a preferred embodiment of the present invention, a method and structure for a wafer level packaging is provided. At first, a semiconductor wafer and a transparent substrate are provided, wherein the semiconductors wafer comprises pluralities of dies thereon. Moreover, pluralities of microcircuits are manufactured on the pluralities of dies by a semiconductor process. The semiconductor wafer comprises silicon or other semiconductor materials, for instance GaAs or InP. The pluralities of dies, which are on the semiconductor wafer, include a photosensitive device. Furthermore, the transparent substrate comprises glass or quartz with a thin film thereof, for instance an anti-reflection (AR) layer, a conductive layer with indium tin oxide (ITO), a UV cut layer or a IR cut layer. Then, a dielectric layer is deposited on the transparent substrate, for instance a silicon oxide layer, a silicon nitride layer or a polymer layer, wherein the polymer film comprises polyimide. Next, a photoresist layer is deposited on the dielectric layer and then a photolithography process is performed on the photoresist layer in order to expose the dielectric layer. Following that, the photoresist layer is utilized as a mask in order to perform an etching process to the dielectric layer. Finally, the photoresist layer is stripped so as to form a plurality of spacer walls, which comprise a dielectric layer on the transparent substrate. The position and shape of the spacer walls correspond to the position and shape of the pluralities of the dies, which are on the semiconductor wafer. The dimensions of the spacer walls are slightly smaller than the spacer walls, and the shape could be that of an arm figure. Besides, the position could be on opposite sites or surrounded on four sides to form a square or rectangle figure, or an L-figure.

As mentioned above, the photolithography process utilizes the pluralities of dies, which are on the semiconductor wafer, as the referable pattern. Then, an auto sealant machine coats a sealant of epoxy adhesive, UV adhesive or thermoplastic adhesive, which joins the inner or outer side wall of the spacer walls. The semiconductor wafer is then covered by a transparent substrate; further, the pluralities of dies and the plurality of spacer walls, which are on the transparent substrate, are aligned. Finally, the process of the packaging is successively accomplished.

The wafer level packaging process is not limited to the methods and structures mentioned above. One way is to form both the spacer walls and the sealant on the semiconductor wafer. Another way is to form the spacer walls on the semiconductor wafer or transparent substrate, but form the sealant on the relative semiconductor wafer or transparent substrate and then perform the same processes as in the foregoing article in the present invention.

BRIEF DESCRIPTION OF THE DRAWINGS

The objectives and features of the present inventions as well as advantages thereof will become apparent from the following detailed description, considered in conjunction with the accompanying drawings. It is to be understood, however, that the drawings, which are not to scale, are designed for the purpose of illustration and not as a definition of the limits of the invention, for which reference should be made to the appended claims.

The present invention can be the best understood through the following description and accompanying drawings, wherein:

FIG. 2A to 2F shows schematically cross-sectional views of various steps of the present invention that a method and structure for a wafer level packaging according to one embodiment of the present invention, wherein the spacer walls are formed on a transparent substrate; and FIG. 3A to 3E shows schematically cross-sectional views of various steps of the present invention that a method and structure for a wafer level packaging according to one embodiment of the present invention, wherein the spacer walls are formed on a semiconductor wafer.

DESCRIPTION OF THE PREFERRED EMBODIMENT

Figure 1A:
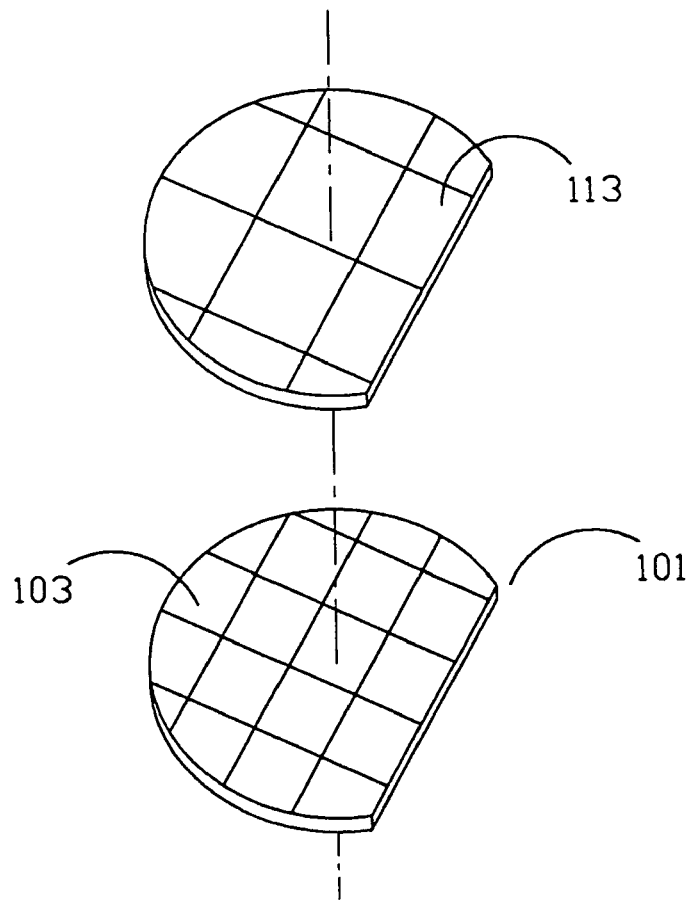
FIG. 1A to 1C shows schematically cross-sectional views of various steps of a conventional method for the packaging process.
Figure 1B:
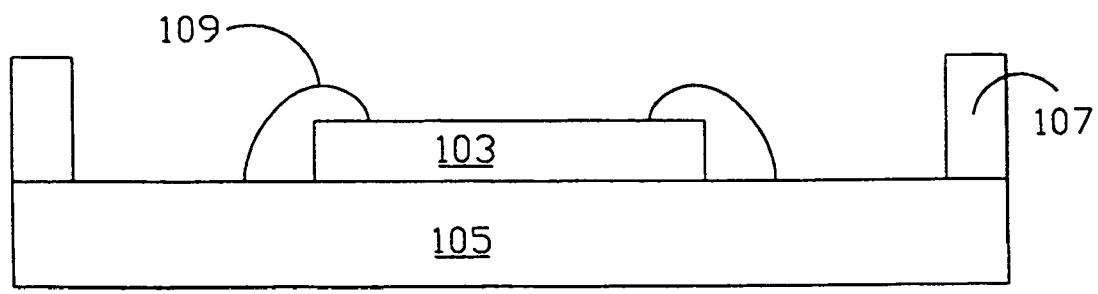
Figure 1C:
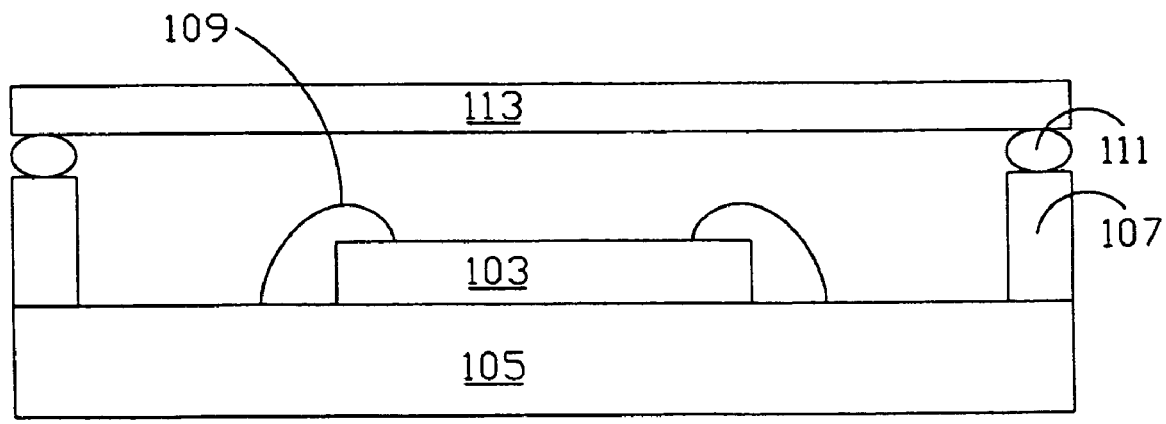
Figure 2A:
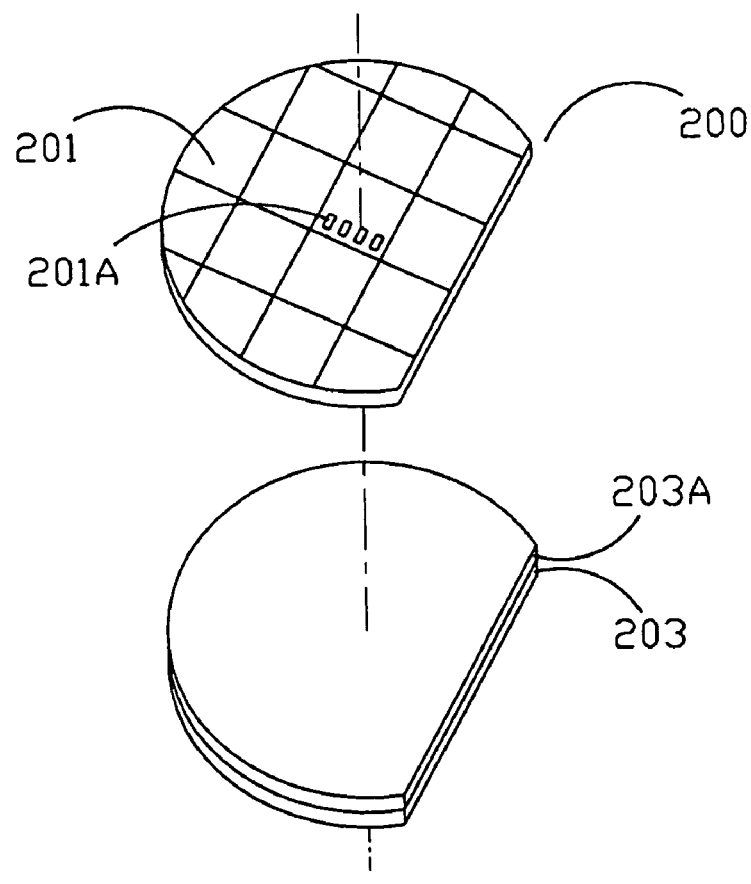

The first preferred embodiment of this invention is explained with reference to the drawings of FIG. 2A to 2F. Referring to FIG. 2A; firstly, providing a semiconductor wafer 200 and a transparent substrate 203 respectively, wherein the semiconductor wafer 200 is formed by a semiconductor material, for instance silicon, GaAs or InP etc. Each of semiconductor wafers 200 includes pluralities of dies 201 adjoined to each other, which have a suitable shape, for instance a rectangular or square. The pluralities of dies 201 comprise a photosensitive device, for instance a CMOS image sensor, liquid crystal on silicon (LcoS) or a charge coupled device (CCD) etc. That is, each die 201 has a photosensitive zone (with reference to numeral 202 illustrated in FIG. 2E). In addition, the pluralities of dies 201 comprise a plurality of fabricated microcircuits (not illustrated). Furthermore, each of the pluralities of dies 201 having a plurality of bonding pads 201A such as aluminum pads, which are deposited on one side or both opposite sides thereof (across from each other), in order to provide the connection points with other substrates after performing a scribing process. The bonding pads 201A utilize the method of chemical vapor deposition (CVD) or physical vapor deposition (PVD) for deposit. Besides, the transparent substrate 203 comprises a thin film 203A, for instance an ITO layer with excellent conductivity properties, an anti-reflection layer, a UV cut layer or a IR cut layer.

Figure 2B:
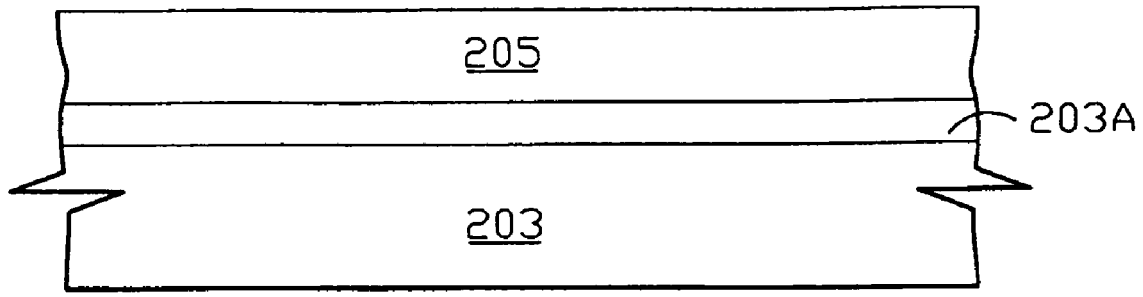

Thereafter, referring to FIG. 2B, providing a transparent substrate 203 firstly, for instance quartz or a glass. The transparent substrate 203 comprises a thin film 203A thereof. Then, a dielectric layer 205 is deposited on the thin film 203A, wherein the material of dielectric layer 205 could be silicon oxide, silicon nitride or a polymer film (for instance polyimide). The dielectric layer 205 can utilize the method of CVD for deposit.

Figure 2C:
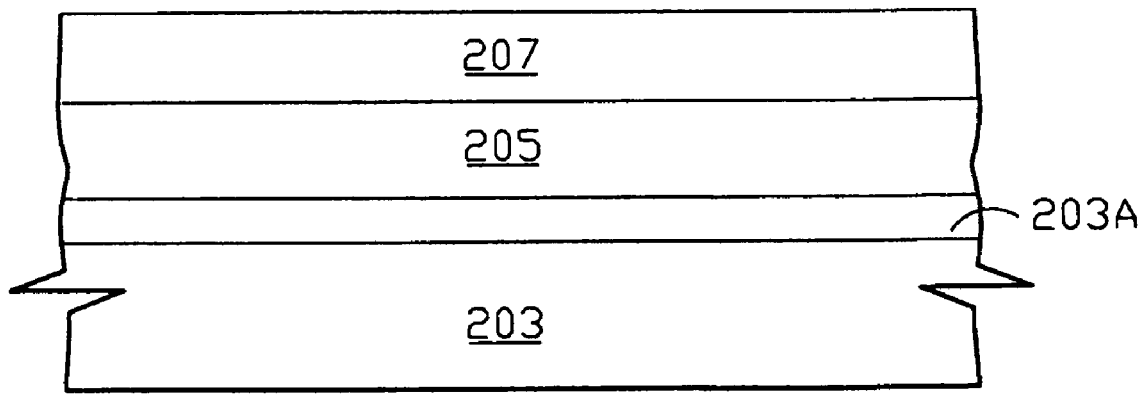
Figure 2D:
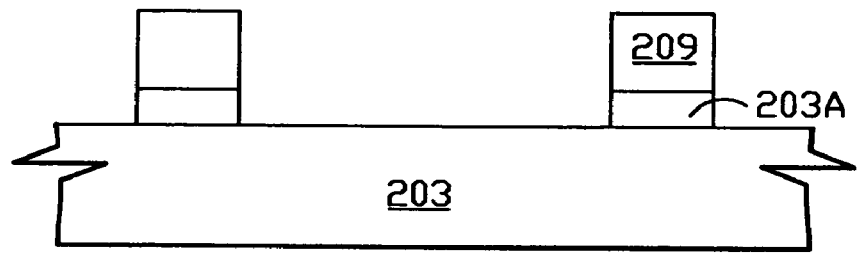

Following, as shown in FIG. 2C, a photoresist layer 207 is coated on the dielectric layer 205 and then the spacer walls 209 are formed on the surface of the transparent substrate 203 by using the exposure, photolithography and etching processes. The formation of spacer walls 209 utilizes the following process: firstly performing an exposing process in order to transfer a mask (not illustrated) with a particular pattern to the photoresist layer 207 by the way of pattern transfer. Then, the post exposure baking process is performed on the exposed photoresist layer 207 in order to reduce the standing wave phenomenon. Next, performing a photolithography process that exposed the photoresist layer 207 is stripped in order to expose the portion of dielectric layer 205. Then, utilizing the unexposed photoresist layer 207 as a mask to remove the exposed dielectric layer 205 and the thin film 203A, which is under the dielectric layer 205. That is, a method of wet etching or dry etching is utilized, for instance hydrofluoric acid (HF) of the wet etching method, plasma etching or reactive ion etch (RIE) of the dry etching method. Finally, the unexposed photoresist layer 207 is stripped in order to form the spacer walls 209 on the transparent substrate 203, as shown in FIG. 2D. The spacer walls 209 comprise a dielectric layer 205 and the thin film 203A, and the height of the spacer walls 209 is decided by the material of the spacer walls 209. The height is typically from 0.1 to several ten micrometers.

Furthermore, the position, shape and dimension of each spacer walls 209 correspond to the shape, position and dimension of the photosensitive zone 202 of the dies 201. Further, the position, shape and dimension of the spacer walls 209 correspond to the shape, location and dimension of the dies 201. In one embodiment of the present invention, the spacer walls 209 can have an arm shape or an arm shape with the plurality of individual, continuous or partially continuous spacer wall units. The position of the spacer walls 209 with an arm shape can refer to the position of the die 201 and place them on opposite sites thereon, more; a dimension is smaller than a length of the one die. In another embodiment, the shape of spacer wall 209 is similar to the shape of one die, and the photosensitive area, which is located on the die. Besides, a dimension is smaller than the perimeter of the one die so as to have a little pitch for using. It is noted that the shape, position and dimension of the spacer walls 209 as mentioned above do not limit the scope of the present invention. Those that can be manufactured by lithography methods are used to balance and support the distance between the transparent substrate 203 and dies, such as L shape, which is included with the scope of the present invention.

Subsequently, referring to FIG. 2E, using sealant 211 as coating, which the width is smaller than 1000 micrometers and the height is smaller than 200 micrometers, beside the inner or outer side wall of the spacer walls 209 by a auto sealant machine. The material of the sealant 211 could be epoxy adhesive, UV adhesive or thermo-plastic adhesive etc. More, the material of the sealant 211 is decided in conjunction with the material of the spacer walls 209. When the polymer film is utilized as the material of spacer walls 209, for instance polyimide, the UV adhesive could be used because of fast curing rate and the characteristic of nonheating. However, when the oxide or nitride film is utilized as the material of the spacer walls 209, any material of sealant as above-mention could be used.

As a result, the position of each spacer walls 209 is determined according to each dimension of dies 201 or the photosensitive zone 202 of the dies 201 . More, the sealant 211 adjoins the inner or outer side wall of each spacer wall 209, the position of the sealant 211 could be controlled. Therefore, the distance between the sealant 211 to the sensor area (photosensitive zone 202) of a die 201 could be shrunk so that the gross dies of a wafer could be improved. Hence, the throughput is increased. Subsequently, a curing step is performed to the sealant 211, for instance the UV radiation or thermal process to harden the sealant is used. Then, a grinding process, which is optional, is used to grind the sealant 211 on the transparent substrate 203. Following that, the semiconductor wafer 200, which comprises pluralities of dies 201, is covered on the transparent substrate 203 and aligned on the pluralities of spacer walls 209 of the transparent substrate 203. Hence, each of the dies 201 is placed between two spacer walls 209. Then, the semiconductor wafer 200 is adhered to the transparent substrate 203 by the sealant 211. Finally, this present invention is successively accomplished.

Due to the fact that the spacer walls 209 are formed in the semiconductor process, the height and uniformity can be precisely controlled. Hence, when the semiconductor wafer is covering and adhering to the transparent substrate, the uniformity of gap, which is between the semiconductor wafer and the transparent substrate, could be controlled. Also, the stability of the sealant could be controlled; therefore, the yield is improved. Further, this method does not need traditional spacer balls to mix with the sealant; therefore, the overall process will be reduced. Also, it can prevent the overflow of spacer balls into the photosensitive zone so that the distance between the sealant and photosensitive zone does not need a safety range; therefore, the throughput is improved.

After accomplishing this invention of a wafer level packaging, utilizing the spacer walls 209 as a scribe line and performing a scribing process, for instance a laser saw, wafer saw etc. In the scribing process, utilizing the whole wafer as an object in order to obtain pluralities of individual dies 201. Further, having pluralities of bonding pads 201A deposited on one side or both opposite sides so as to form the connecting points with the outside, wherein performing a way of cutting askew in order to expose the bonding pads 201A. As a result, the present invention performs a scribing process after accomplishing the packaging for the semiconductor wafer 200. Therefore, the manufacturing time can be reduced, also; the opportunity of dropping the dies and the contamination of particles on the dies is greatly reduced, and the yield is improved.

Figure 2E:
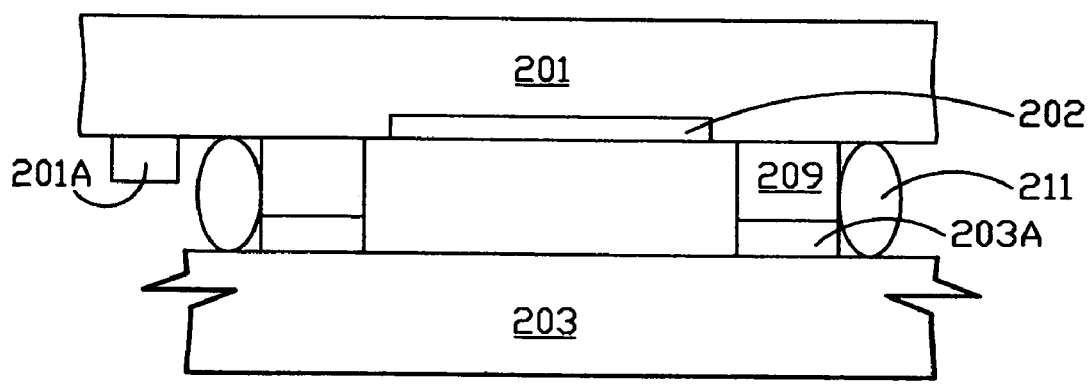

FIG. 2F is an assistant illustration to FIG. 2E that a situation for the semiconductor wafer 200 adheres with the transparent substrate 203.

Figure 3B:
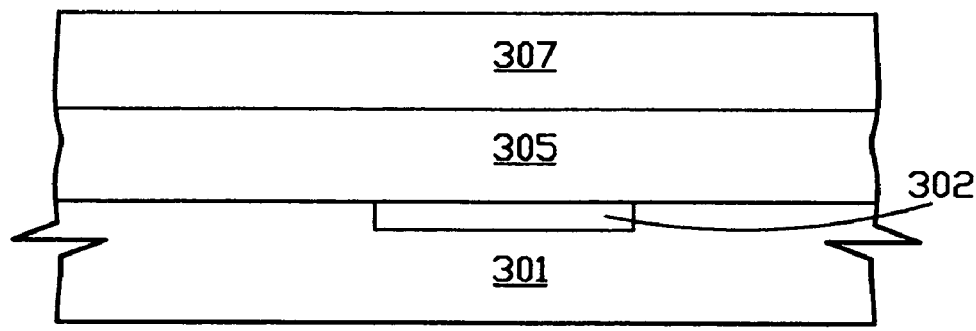

The second preferred embodiment of this invention could be explained with reference to the drawings of FIG. 3A to 3E. Referring to FIG. 3A firstly, providing a semiconductor wafer 300 and a transparent substrate 303 respectively, wherein the semiconductor wafer 300 comprises a semiconductor material, for instance silicon, GaAs or InP etc. Each of semiconductor wafers 300 comprises pluralities of dies 301 that have the suitable shape and adjoin to each another, for instance rectangular shape or square shape. Each of pluralities of dies 301 comprises a photosensitive device, for instance CMOS image sensor, liquid crystal on silicon (LcoS), charge coupled device (CCD) etc. That is, each die 301 has a photosensitive zone 302. In addition, the pluralities of dies 301 comprise a plurality of fabricated microcircuits (not illustrated). Furthermore, each of the pluralities of dies has a plurality of bonding pads 301A, for instance aluminum pads, and depositing on the one side or opposite sides thereof that provide the connection points with other substrates after a scribing process is performed. The bonding pads 301A utilizes the method of chemical vapor deposition (CVD) or physical vapor deposition (PVD) for deposit. Besides, the transparent substrate 303 comprises a thin film 303A, for instance an ITO layer with the property of excellent conductivity, an anti-reflection layer, a UV cut layer or a IR cut layer.

Subsequently, referring to FIG. 3B, a dielectric layer 305 is deposited on the semiconductor wafer 300, wherein the semiconductor wafer 300 comprises pluralities of dies 301 thereon. The material of the dielectric layer 305 could be silicon oxide, silicon nitride or a polymer film (such as polyimide). Next, a photoresist layer 307 is coated on the dielectric layer 305, more; the dielectric layer 305 and the photoresist layer 307 utilizes the method of CVD for deposit.

Figure 3C:
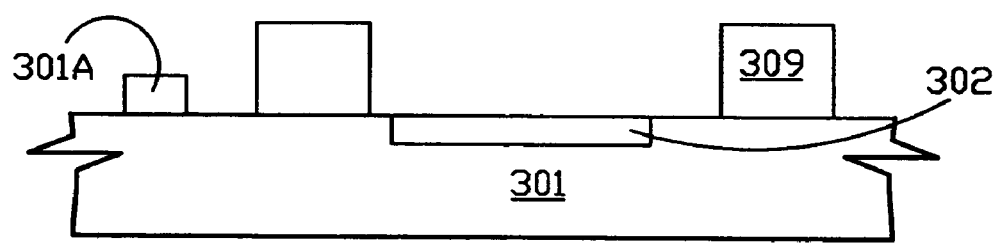

After depositing a photoresist layer 307 on the dielectric layer 305, sequentially, as shown in FIG. 3C, utilizing the exposure, photolithography and etching processes to form the spacer walls 309 on the surface of the dies 301 of the semiconductor wafer 300. The formation of the spacer walls 309 utilizes the processes as follows: at first, performing a photolithography process in order to transfer a mask (not illustrated) with a particular pattern to the photoresist layer 307 by the way of the pattern transfer. Then, the process of post exposure baking is performed on the exposed photoresist layer 307 in order to reduce the standing wave phenomenon. Next, performing a photolithography process that exposes the photoresist layer 307 is stripped in order to expose the portion of the dielectric layer 305. Then, utilizing the unexposed photoresist layer 307 as a mask in order to remove the exposed dielectric layer 305, wherein a method of wet etching or dry etching is utilized, for instance hydrofluoric acid (HF) of wet etching method, plasma etching or reactive ion etch (RIE) of dry etching method. Finally, after stripping the unexposed photoresist layer 307, the space walls 309 are formed on each of the pluralities of dies 301 of semiconductor wafer 300, for instance, placed on the opposite sites. The spacer walls 309 comprise dielectric layer 305, and the height of spacer walls 309 is decided by the material of spacer walls 309 that is used. The height is typically from 0.1 to several ten micrometers.

Furthermore, the position, shape and dimension of each spacer wall 309 correspond to the shape, position and dimension of the photosensitive zone 302 of the dies 301. Further, the position, shape and dimension of the spacer walls 309 correspond to the shape, position and dimension of the dies 301. In one embodiment of the present invention, the spacer walls 309 have an arm shape or have an arm shape with the plurality of individual, continuous or partially continuous spacer wall units. The position of the spacer walls 309 with an arm shape can refer to the position of the die 301 and placing to the opposite sites thereon, furthermore; the dimension is smaller than the length of one die. In another embodiment, the shape of one spacer walls 309 is similar to the shape of one die, and has a dimension smaller than the perimeter of one die so as to have a little pitch for using. It is noted that these embodiments mentioned above do not limit the scope of the present invention. Those that can be manufactured by lithography methods are used to balance and support the distance between the transparent substrate 303 and dies, such as L shape, which is included with the scope of the present invention.

Subsequently, referring to FIG. 3D, using the sealant 311 as coating, which the width is smaller than 1000 micrometers and the height is smaller than 200 micrometers. Beside the inner or outer side wall of the spacer walls 309 by a auto sealant machine. The material of the sealant 311 could be an epoxy adhesive, UV adhesive or thermoplastic adhesive etc. More, the material of the sealant 311 is decided in conjunction with the material of the spacer walls 309. When the polymer film is utilized as the material of the spacer walls 309, for instance polyimide, the UV adhesive could be used because of fast curing rate and the characteristic of nonheating. However, when the oxide or the nitride film is utilized as the material of spacer walls 309, any material of sealant as mention above could be used.

As a result, the position of the spacer walls 309 is determined according to the dimension of each of the dies 301, and the sealant 311 adjoining to the inner side wall or outer side wall of the spacer walls 309. Therefore, the position of sealant 311 could be controlled, and the distance between the sealant 311 to the photosensitive zone 301, of a die 301, could be effectively reduced. Hence, the gross dies of a wafer could be improved and the throughput is increased. Subsequently, a curing step is performed for the sealant 311, for instance the UV radiation or thermal process to harden the sealant. Then, a grinding process, which is optional, is used to grind the sealant 311 on the semiconductor wafer 300. Following that, a transparent substrate 303 which comprises a thin film 303A, covers the semiconductor wafer 300 and is aligned with the pluralities of spacer walls 309 of semiconductor wafer 300. Hence, each of the dies 301 is placed between two spacer walls 309 and then the semiconductor wafer 300 is adhered with the transparent substrate 303 by sealant 311. Finally, this present invention is successively accomplished. Due to the fact that the spacer walls 309 are formed with the semiconductor process, the height and uniformity can be precisely controlled. Hence, when the semiconductor wafer is covering and adhering with the transparent substrate, the uniformity of gaps, which are between the semiconductor wafer and transparent substrate, could be controlled. In addition, the stability of the sealant could be also controlled; therefore, the yield is improved. Further, this method does not need traditional spacer balls to mix with the sealant 311; therefore, the process will be reduced. Also, it can prevent the spacer balls overflow into the photosensitive zone so that the distance between the sealant and photosensitive zone does not need a safety range; therefore, the throughput is improved.

Next, in accordance with the present invention of wafer level packaging, utilizing the spacer walls 309 as a scribe line and performing a scribing process, for instance a laser saw, wafer saw etc. In the scribing process, utilizing the whole wafer as an object in order to obtain pluralities of individual dies 301. More, on the one side or opposite sides a plurality of bonding pads 301A are deposited thereon and then performing a way of cutting askew in order to expose the bonding pads 301A as a connecting point with the outsides. As a result, the present invention that performs a scribing process after accomplishing the packaging for the semiconductor wafer 300. Therefore, the manufacturing time can be reduced, moreover; the opportunity in the dropping of dies and the contamination from particles on the dies is greatly reduced, and the yield is improved.

Figure 3D:
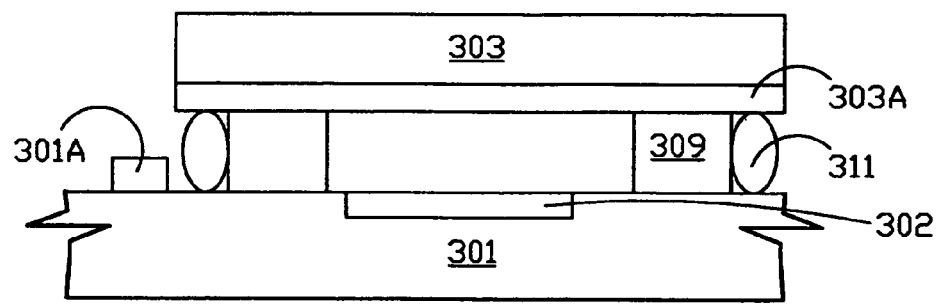
Figure 3E:
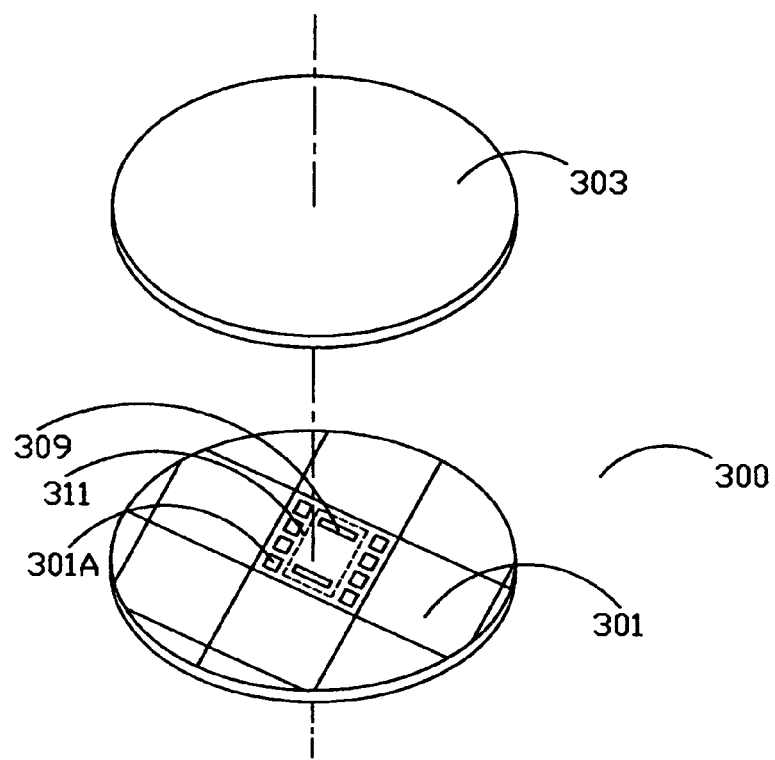

FIG. 3E is an assistant illustration to FIG. 3D that a situation for the semiconductor wafer 300 is covered and adhered to the transparent substrate 303.

In accordance with the first and second embodiment of this invention, the other embodiments will be also performed. For instance, the spacer walls could be formed on a semiconductor wafer or transparent substrate respectively. The sealant is coated on another relative semiconductor or transparent substrate. Then, a scribing process will be performed in order to obtain the individual die, which is already accomplished in the packaging process.

In accordance with the preferred embodiments as mention above, it can be realized that one of the advantages is to form the spacer walls. The formation of the spacer walls can precisely decide the position of the sealant, further, the dimension of the device could be controlled. Therefore, the gross dies, which perform a scribing process for a wafer, will be improved. Besides, precisely controlling the height of the spacer walls will control the gap between the semiconductor wafer and the transparent substrate and the stability of the sealant. Furthermore, a scribing process is performed after the semiconductor wafer and the transparent substrate is adhered, hence, the throughput is enhanced.

The preferred embodiments are only used to illustrate the present invention, not intended to limit the scope thereof. Many modifications of the preferred embodiments can be made without departing from the spirit of the present invention.

What is claimed is:

1. A method for a wafer level packaging, comprising:
   providing a semiconductor wafer, wherein said semiconductor wafer comprises pluralities of dies thereon;
   depositing a dielectric layer on said semiconductor wafer and said pluralities of dies are covered;
   removing a portion of said dielectric layer in order to form pluralities of spacer walls on said pluralities of dies;
   forming pluralities of sealant adjoining on a side wall of said pluralities of spacer walls;
   covering a transparent substrate on said semiconductor wafer; and
   dicing said semiconductor wafer covered by said transparent substrate into said pluralities of dies individually.

2. The method for a wafer level packaging according to claim 1, wherein each of said pluralities of dies comprises a photosensitive zone.

3. The method for a wafer level packaging according to claim 1, wherein a step for removing said dielectric layer comprises exposing a photosensitive zone.

4. The method for a wafer level packaging according to claim 3, wherein said photosensitive zone further comprises surrounding by four of said pluralities of spacer walls.

5. The method for a wafer level packaging according to claim 1, wherein said side wall is an inner side wall.

6. The method for a wafer level packaging according to claim 1, wherein said side wall is a outer side wall.

7. The method for a wafer level packaging according to claim 1, wherein a material of said transparent substrate is quartz.

8. A method for a wafer level packaging, comprising:
   providing a semiconductor wafer and a transparent substrate, wherein said semiconductor wafer comprises pluralities of dies thereon;
   depositing a dielectric layer on said transparent substrate;
   depositing a photoresist layer on said dielectric layer;
   removing a portion of said photoresist layer in order to expose a portion of said dielectric layer;
   removing a portion of said exposed dielectric layer, utilizing said photoresist layer as a mask in order to form pluralities of spacer walls on said transparent substrate;
   forming pluralities of sealant adjoining a side wall of said pluralities of spacer walls;
   covering said semiconductor wafer on said transparent substrate; and
   dicing said semiconductor wafer covered by said transparent substrate into said pluralities of dies individually.

9. The method for a wafer level packaging according to claim 8, wherein a step for removing said portion of said exposed dielectric layer comprises utilizing said pluralities of dies of said semiconductor wafer as a referable pattern.

10. The method for a wafer level packaging according to claim 8, wherein said side wall is an inner side wall.

11. The method for a wafer level packaging according to claim 8, wherein said side wall is an outer side wall.

12. The method for a wafer level packaging according to claim 8, wherein each of said pluralities of dies comprises a photosensitive zone.

* * * * *